United States Patent [19]
Naito

[11] 4,237,556
[45] Dec. 2, 1980

[54] SUPERHETERODYNE RECEIVER HAVING DISTORTION REDUCING CIRCUITRY

[75] Inventor: Michinori Naito, Tokyo, Japan

[73] Assignee: Trio Kabushiki Kaisha, Tokyo, Japan

[21] Appl. No.: 17,815

[22] Filed: Mar. 5, 1979

[30] Foreign Application Priority Data

| Mar. 6, 1978 | [JP] | Japan | 53-25232 |
| Sep. 20, 1978 | [JP] | Japan | 53-116116 |
| Sep. 20, 1978 | [JP] | Japan | 53-116117 |
| Sep. 20, 1978 | [JP] | Japan | 53-116118 |
| Oct. 2, 1978 | [JP] | Japan | 53-121340 |

[51] Int. Cl.³ .......................... H04B 1/10; H04B 1/16
[52] U.S. Cl. .................................. 455/154; 455/173; 455/196; 455/208
[58] Field of Search .................. 329/50, 122, 123; 179/1 GB; 455/192, 173, 154, 155, 196, 197, 208, 209, 265, 170

[56] References Cited
U.S. PATENT DOCUMENTS

| 2,677,049 | 4/1954 | Rogers | 325/346 |
| 3,069,625 | 12/1962 | Morita et al. | 325/346 |
| 3,160,815 | 12/1964 | Ford et al. | 325/346 |
| 3,189,825 | 6/1965 | Lahti et al. | 325/346 |
| 3,371,281 | 2/1968 | Powell | 325/346 |
| 3,673,499 | 6/1972 | Avins | 325/344 |

*Primary Examiner*—Jin F. Ng
*Attorney, Agent, or Firm*—Gerald J. Ferguson, Jr.; Joseph J. Baker

[57] ABSTRACT

A superheterodyne receiver having means for detecting distortion in the intermediate frequency signal and for controlling the local oscillator frequency in accordance with the detected distortion to thereby minimize the distortion.

Means are also disclosed for facilitating the use of a tuning indicator with the receiver, for enhancing the manipulability of a tuning knob of the receiver, for minimizing the effect of noise and interference on the receiver and for compensating for distortion present in the distortion detecting means.

24 Claims, 12 Drawing Figures

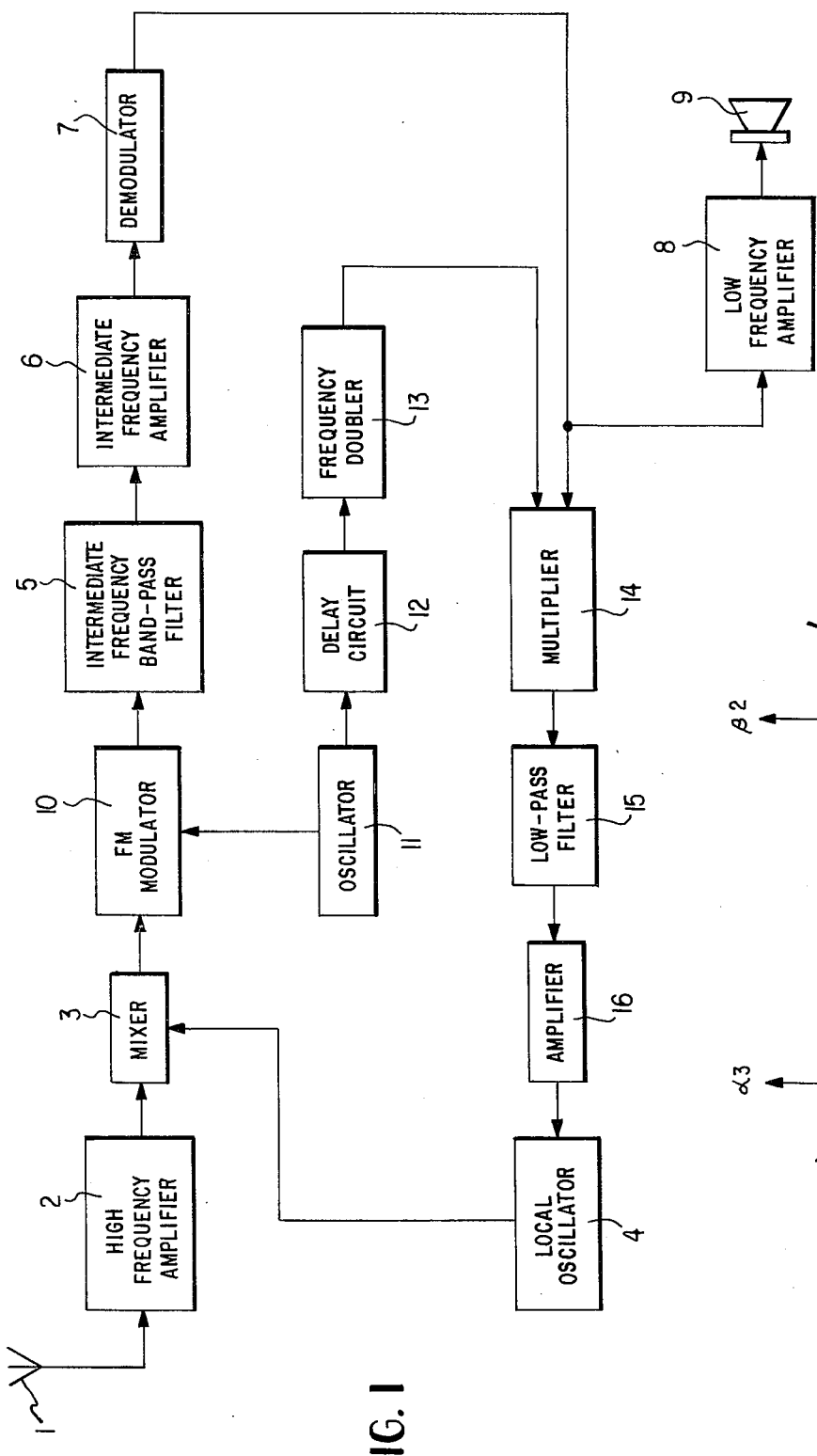
FIG. 1
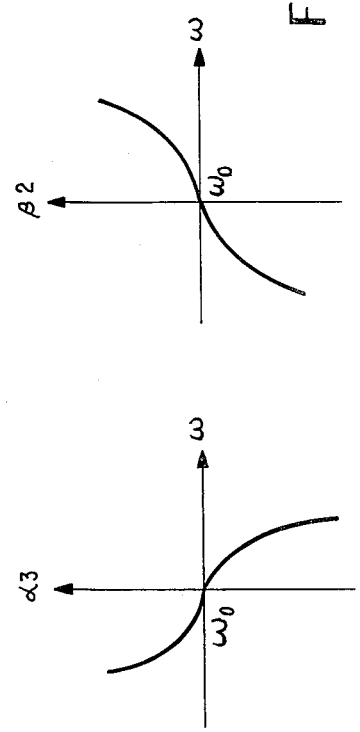
FIG. 3
FIG. 2

SUPERHETERODYNE RECEIVER HAVING DISTORTION REDUCING CIRCUITRY

BACKGROUND OF THE INVENTION

This invention relates to a superheterodyne receiver such as an FM receiver that is controlled to effect reception with minimum distortion at all times.

It is known distortion in a superheterodyne receiver such as an FM receiver occurs at the intermediate frequency bandpass filter and the demodulator. This distortion occurs even at steady state and, furthermore, it fluctuates with changes in the ambient temperature of the receiver. Heretofore, various locking mechanisms for controlling this distortion have been employed so that the received frequency does not change. However, these means have not been sufficient in that reception cannot be made with minimum distortion at all times.

SUMMARY OF THE INVENTION

This invention was made in view of the above problem and its object is to provide a superheterodyne receiver such as an FM receiver that detects the distortion itself to thereby effect reception with minimum distortion at all times.

Accordingly, the receiver is provided with distortion detecting loop comprising means for frequency modulating the intermediate frequency signals thereof with a fixed modulation frequency, means for demodulating the intermediate frequency signals whose frequency has been modulated with the fixed modulation frequency, means for synchronously detecting the demodulated output from the demodulation means with a further fixed frequency which is n times the fixed modulation frequency where n is an integer having a value of at least 2, and means for controlling the oscillation frequency of the local oscillator of the FM receiver with the output of the synchronous detector to thereby reduce to a minimum distortion due to the amplitude characteristic or phase characteristic of the intermediate frequency band-pass filter affected by tuning and detuning.

Other objects and advantages of this invention will be apparent from a reading of the following specification and claims taken with the drawing.

BRIEF DESCRIPTION OF THE DRAWING

FIG. 1 is a block diagram of an FM receiver of a first embodiment of this invention.

FIG. 2 and FIG. 3 are diagrams which are employed to illustrate the operation of the FM receiver of the first embodiment.

DETAILED DESCRIPTION OF PREFERRED EMBODIMENTS OF THE INVENTION

Figure 4:
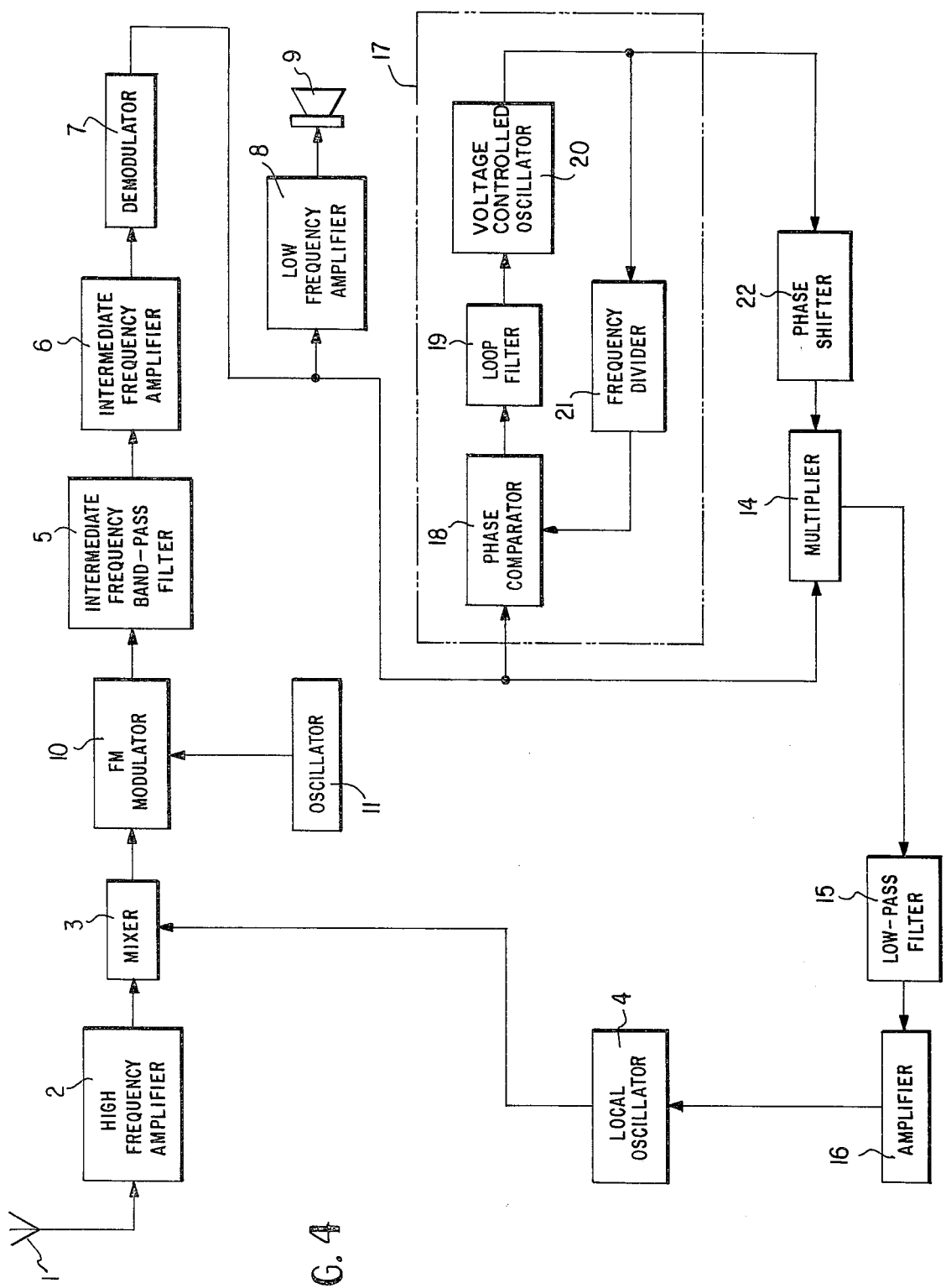
FIG. 4 is a block diagram of an FM receiver of the second embodiment of this invention.

Reference should be made to the drawing where like reference numerals refer to like parts.

FIG. 1 is a block diagram of a superheterodyne receiver such as an FM receiver in accordance with an embodiment of this invention. 1 is an antenna, 2 is a high frequency amplifier, 3 is a mixer, 4 is a local oscillator comprising a voltage controlled oscillator, 5 is an intermediate frequency bandpass filter, 6 is an intermediate frequency amplifier, 7 is a demodulator, 8 is a low frequency amplifier, and 9 is a speaker, the foregoing being connected to comprise an FM receiver. An FM modulator 10 is disposed between mixer 3 and intermediate frequency band-pass filter 5. 11 is an oscillator that applies modulating signals to an FM modulator 10 so that the intermediate frequency is modulated by the angular output frequency p of oscillator 11. The angular modulating frequency p is so selected that it does not affect the FM reception signals.

The output of oscillator 11 is also applied to a delay circuit 12, the output of which, in turn, is applied to a frequency doubler although, generally speaking, the frequency of oscillator 11 may be multiplied by an integer n whose value is at least two. The output of doubler 13 is applied as one input to a multiplier 14 that comprises a synchronous detector together with a low-pass filter 15. The other input to multiplier 14 is the output of demodulator 7. The output of multiplier 14 is applied to low-pass filter 15, the output of filter 15 being applied to an amplifier 16. The output of amplifier 16 is applied to local oscillator 4 to control the frequency thereof.

Assume the output of high frequency amplifier 2 is $S_1 = \cos \omega_1 t$ and the output of local oscillator 4 is $S_2 = \cos \omega_2 t$, when the output of high frequency amplifier 2, $S_1$, and the output of local oscillator 4, $S_2$, are impressed on mixer 3, sum and difference frequency components $(\omega_1 - \omega_2)$ and $(\omega_1 + \omega_2)$ appear at the output of mixer 3, $S_3$. If only the $(\omega_1 - \omega_2)$ component is considered, $S_3 = \cos \omega_{00} t$ results where $\omega_{00} = \omega_1 - \omega_2$. The output frequency of mixer 3, $S_3$, is modulated by oscillator 11, $S_4 = \cos pt$, and the output of FM modulator 10, $S_5$, is an FM wave, $S_5 = \cos (\omega_{00} t + \Delta \omega / p \sin pt)$.

Distortion generally occurs in the phase component of the output of FM modulator 10, $S_5$, after it passes through intermediate frequency band-pass filter 5. After the distorted FM wave is demodulated by demodulator 7, a distortion component of $$k_1 \alpha_3 p^2 \Delta \omega^2 \cos 2pt - k_2 \beta_2 p \Delta \omega^2 \sin 2pt \tag{1}$$

occurs with respect to the basic wave of $\Delta \omega \cos pt$ if only the second harmonic frequency is considered where:

p = angular modulation frequency;

$\alpha_3$ = the third order differential coefficient of the amplitude characteristic of intermediate frequency band-pass filter 5;

$\beta_2$ = the second order differential coefficient of the phase characteristic of intermediate frequency band-pass filter 5;

$\Delta \omega$ = the angular frequency deviation; and $k_1$ and $k_2$ = constants.

Therefore, the output of demodulator 7, $S_6$, becomes $$S_6 = \Delta\omega \cos pt + k_1\alpha_3 p^2 \Delta\omega^2 \cos 2pt - K_2\beta_2 p\Delta\omega_2 \sin 2pt \qquad (2)$$

The following explanation is given for the case when the relationship of the distortion component of the amplitude characteristic, $D_\alpha = k_1\alpha_3 p^2 \cos 2pt$ and the distortion component of the phase characteristic, $D_\beta = k_2\beta_2 p\Delta\omega^2 \sin 2pt$ is $D_\alpha \gg D_\beta$. The output of demodulator 7, $S_6$, becomes $S_{6'}$ in this case, and the output $S_{6'}$ becomes $$S_{6'} = \Delta\omega \cos pt + K_1\alpha_3 p^2 \Delta\omega^2 \cos 2pt \qquad (3)$$

This output $S_{6'}$ is one of the inputs to multiplier 14.

As for the other input to multiplier 14, $S_7$, if the output of oscillator 11, $S_4$, were directly applied to frequency doubler 13 without being delayed by delay circuit 12, the output of frequency doubler 13, would be $S_{7'} = \cos 2pt$.

Therefore, the output of multiplier 14, $S_{8'}$ would be $$S_{8'} = S_{6'} \times S_{7'} = \tfrac{1}{2}\Delta\omega \cos pt = \tfrac{1}{2}\Delta\omega \cos 3pt + \tfrac{1}{2}K_1\alpha_3 p^2 \Delta\omega^2 \cos 4pt + \tfrac{1}{2}k_1\alpha_3 p\Delta\omega^2$$

and the output of low pass filter 15 would be $$S_{9'} = \tfrac{1}{2}k_1\alpha_3 p^2 \Delta\omega 2$$

where the similarity between the amplitude characteristic distortion (Equation (3)) and the above output of filter 15 should be noted.

The third order differential coefficient of the amplitude characteristics of intermediate frequency band-pass filter 5, $\alpha_3$, normally changes as shown in FIG. 2 where the angular center frequency of intermediate frequency band-pass filter 5 is denoted as $\omega_0$, and the detuned angular frequency is plotted on the abscissa from the angular center frequency $\omega_0$. Therefore, the third order differential coefficient of the amplitude characteristic of intermediate frequency band-pass filter 5, $\alpha_3$, in the vicinity of the center angular frequency $\omega_0$ can be approximated as $\alpha_3 = -k_0(\omega - \omega_0)$, where $k_0$ is a constant. Thus, the output of low-pass filter 15, $S_{9'}$, becomes $$S_{9'} = -\tfrac{1}{2}k_0 k_1 (\omega - \omega_0) p^2 \Delta\omega^2$$

and the output of low-pass filter 15, $S_{9'}$, becomes zero when the operational angular frequency $\omega$ is $\omega = \omega_0$, negative when $\omega > \omega_0$, and positive when $\omega < \omega_0$. This output is a DC voltage that changes positive or negative as the operational angular frequency $\omega$ changes with respect to the angular center frequency $\omega_0$.

Therefore, this output of low-pass filter 15, $S_{9'}$, is amplified by amplifier 16 and applied to local oscillator 4 to adjust the frequency thereof. The angular frequency $\omega_{00}$ of the output of mixer 3, $S_3$, is thus controlled by the output of lowpass filter 15, $S_{9'}$, to approach the center angular frequency $\omega_0$ of the intermediate frequency band-pass filter 5 at all times, thus effecting operation of the FM receiver with a minimum amplitude characteristic distortion component $D_{60}$ at all times.

In the above explanation, it was assumed that the output of oscillator 11, $S_4$, was directly applied to frequency doubler 13 without being delayed by delay circuit 12. Since the output of FM modulator 10, $S_5$, passes through intermediate frequency band-pass filter 5, etc., the output of demodulator 7, $S_{6'}$, is delayed with respect to the output of oscillator 11, $S_4$. A delay time identical to the above delay time is provided by delay circuit 12 so that the phases of the output of oscillator 11, $S_4$, and the output of demodulator 7, $S_{6'}$, are the same at the input terminals to multiplier 14. Thus, the conclusion of the above explanation results.

Next, an explanation will be given for the case where the distortion component of the amplitude characteristic, $D_\alpha, \ll$ the distortion component of the phase characteristic, $D_\beta$. The output of modulator 7, $S_{6''}$, in this case becomes $$S_{6''} = \Delta\omega \cos pt - k_2\beta_2 p\Delta\omega^2 \sin 2pt$$

and this output $S_{6''}$ is one of the inputs to multiplier 14. As for the other input to multiplier 14, the output of oscillator 11, $S_4$, is delayed by delay circuit 12 by $\pi/4$ radian and applied to frequency doubler 13. The output of doubler 13, $S_{7''}$, becomes $$S_{7''} = [\cos(pt - \pi/4)]^2 = -\tfrac{1}{2}\sin 2pt + 1$$

Therefore, the output of multiplier 14, $S_{8''}$, becomes $S_{8''} = S_{6''} \times S_{7''}$, and the output of low-pass filter 15, $S_{9''}$, becomes $$S_{9''} = \tfrac{1}{2}k_2\beta_2 p\Delta\omega^2$$

where the similarity between the phase characteristic distortion (Equation (2)) and the above output of filter 15 should be noted. The second order differential coefficient of the phase characteristic of intermediate frequency band-pass filter 5, $\beta_2$, normally changes as shown in FIG. 3 where the angular center frequency of intermediate frequency band-pass filter 5 is $\omega_0$, and the detuned angular frequency is plotted on the abscissa with respect to the center angular frequency $\omega_0$. Therefore, the second order differential coefficient of the phase characteristic of the intermediate frequency band-pass filter, $\beta_2$, in the vicinity of the angular center frequency, $\omega_0$, can be approximated by $\beta_2 = k_0'(\omega - \omega_0)$, where $k_0'$ is a constant. Thus, the output of the low-pass filter 15, $S_{9''}$ becomes $$S_{9''} = \tfrac{1}{2}k_0' k_2 (\omega - \omega_0) p\Delta\omega^2$$

where this output is a DC voltage that changes positive or negative as the operation angular frequency $\omega$ changes with respect to the angular center frequency $\omega_0$. This is the same as the previous output $S_9$, with different polarity.

The output of low-pass filter 15, $S_{9''}$, is amplified by amplifier 16 and applied to local oscillator 4 to adjust the frequency thereof. The angular frequency $\omega_{00}$ of the output of mixer 3, $S_3$, is thus controlled by the output of low-pass filter 15, $S_{9''}$, to approach the center angular frequency $\omega_0$ at all times, thus effecting operation of the FM receiver with a minimum phase characteristic distortion component $D_\beta$ at all times.

In the above explanation, the output of oscillator 11, $S_4$, was delayed by delay circuit 12 by $\pi/4$ radian and applied to doubler 13. As mentioned previously, since the output of demodulator 7, $S_{6''}$, is delayed with respect to the output of oscillator 11, $S_4$, the results in the above explanation can be obtained by setting delay circuit 12 with an identical delay time equal to the above delay time plus the aforesaid $\pi/4$ radian.

The above explanations are directed to the cases where the relationships between the amplitude characteristic distortion component $D_\alpha$ and the phase characteristic distortion component $D_\beta$ are $D_\alpha >> D_\beta$ and $D_\alpha << D_{62}$ respectively. Ordinarily, when the intermediate frequency band-pass filter of an FM receiver is decided upon, $D_\alpha >> D_{62}$ or $D_\alpha << D_\beta$ is determined by that filter. Therefore, the delay time of delay circuit 12 may be set in accordance with the relative values of the distortion components $D_\alpha$ and $D_\beta$.

A second embodiment of the invention will now be described with respect to FIG. 4, which shows the use of a phase locked loop circuit in place of frequency doubler 13 of the first embodiment. The angular modulation frequency p is the same frequency as in the first embodiment. The output of demodulator 7 is one input to multiplier 14. It is also applied to phase comparator 18 of phase locked loop circuit 17 which comprises a phase comparator 18, a loop filter 19, a voltage controlled oscillator 20, a frequency divider 21 with a frequency dividing ratio of ½. The output of phase locked loop circuit 17—that is, the output of voltage controlled oscillator 20, is the other input to multiplier 14 through a phase shifter 22. The output of multiplier 14 is applied to local oscillator 4 through low pass filter 15 and amplifier 16 to adjust the frequency thereof. The output of demodulator 7, $S_6$, contains a $\Delta\omega \cos pt$ component as explained in the first example. Thus, the output of voltage controlled oscillator 20 is a signal of frequency $2p$ whose phase is synchronized to $\Delta\omega \cos pt$. Therefore, the output of the doubler of FIG. 1 is effected by phase locked loop circuit 17. The operation of the second embodiment is the same as that of the first and thus, a detailed explanation thereof will not be given.

Figure 5:
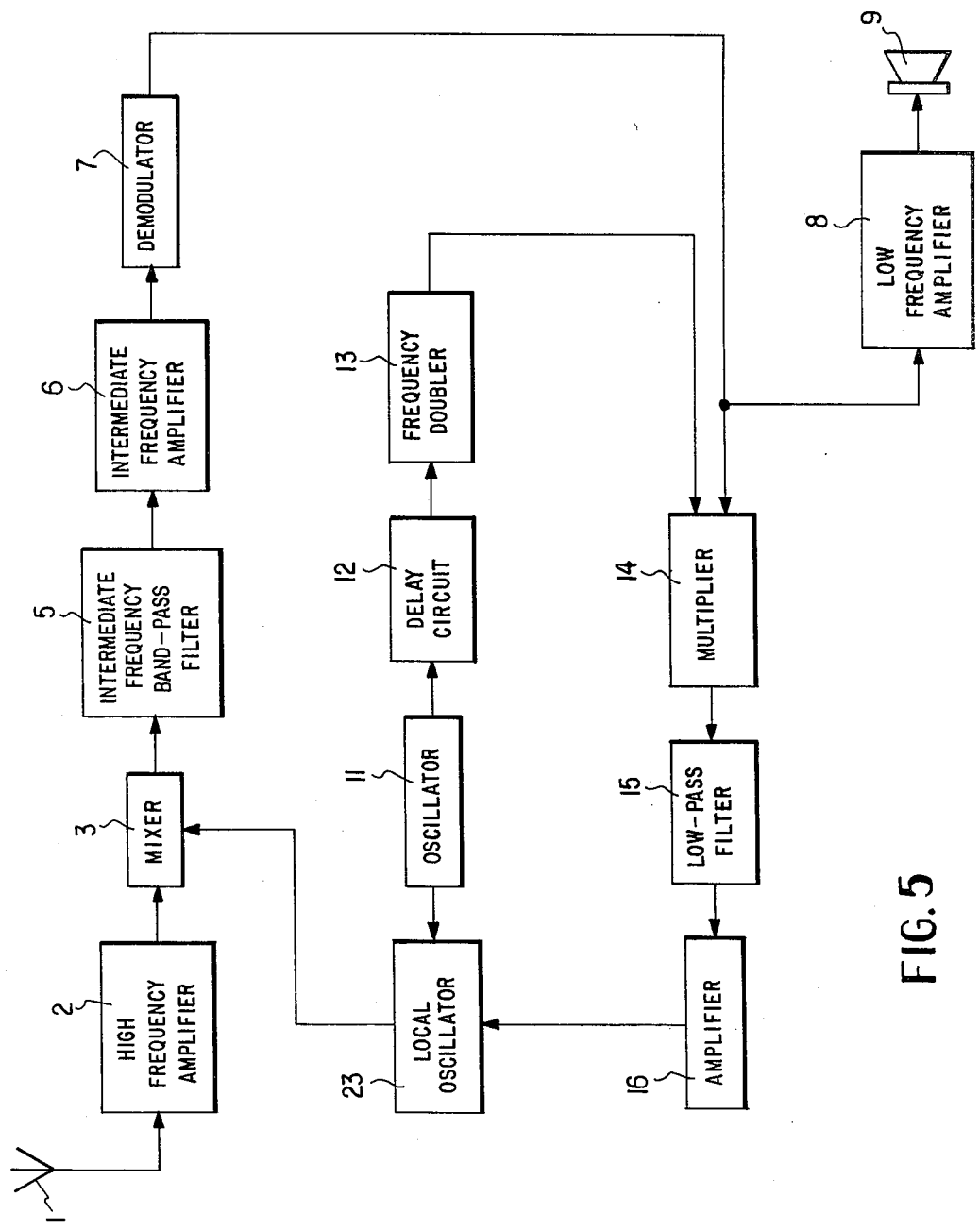
FIG. 5 is a block diagram of an FM receiver of the third embodiment of this invention.

A third embodiment of the invention will not be given with respect to FIG. 5, where 23 is a local oscillator having first and second input terminals, its output being frequency modulated by the output of oscillator 11 which is applied to the first input terminal. Its output frequency is also changed in accordance with a DC voltage impressed on the second input terminal—namely, the output voltage of amplifier 16. The output angular frequency p of oscillator 11 is so selected that it does not affect the FM reception signals. Since the output frequency of local oscillator 23 is modulated by the angular output frequency p of oscillator 11, a modulated signal with a fixed level of angular frequency p is generated in the intermediate frequency signals of the received signals.

Assume the output of high frequency amplifier 2 is denoted as $S_1 = \cos \omega_1 t$ and the output of local oscillator 23 with no output from oscillator 11 as $S_{2'} = \cos \omega_2 t$ when the output of high frequency amplifier 2, $S_1$, and the output of local oscillator 23, $S_{2'}$, are applied to mixer 3, the sum and difference frequency components, $(\omega_1 - \omega_2)$ and $(\omega_1 + \omega_2)$ appear at the mixer 3 output, $S_{3'}$. If only the $(\omega_1 - \omega_2)$ component is considered, $S_{3'} = \cos \omega_{00} t$ where $\omega_{00} = \omega_1 - \omega_2$. Thus, when the output frequency of local oscillator 23 is modulated with the output of oscillator 11, $S_4 = \cos pt$, the output $S_3$ of mixer 3 becomes an FM wave, $S_3 = \cos(\omega_{00} t - \Delta\omega/p \sin pt)$, while passing through intermediate band-pass filter 5, the FM wave is distorted by the amplitude characteristic and the phase characteristic of the intermediate frequency band-pass filter 5 as well as by demodulator 7. Synchronous detection of the output of demodulator 7 is effected with a frequency double that of the angular modulation frequency p and the oscillation frequency of local oscillator 23 is controlled by the output resulting from synchronous detection.

Consequently, as in the case of the first embodiment, control is effected with respect to the amplitude characteristic distortion component, $D_\alpha$, and the phase characteristic distortion component, $D_\beta$, of the intermediate frequency bandpass filter to make $\omega_{00}$ approach the angular center frequency of the intermediate frequency band-pass filter 5 at all times. Accordingly, the FM receiver minimizes the amplitude characteristic distortion component $D_\alpha$ and the phase characteristic distortion component $D_\beta$ at all times. The operation during this process is the same as that described for the first embodiment and thus, a further detailed explanation will not be given.

Next, the value of the angular output frequency p of modulation frequency oscillator 11 will be explained for the first, second, and the third embodiments. For convenience of explanation, the angular frequency p is changed hereinafter to frequency $f_p$. The optimal output frequency $f_p$ of oscillator 11 is selected as $38 \times m$ kHz, where $m = 2, 3, 4 \ldots$, or $19 \times (2m-1) - 4 < f_p < 19 \times (2m-1) + 4$ kHz. The modulation frequency $f_p$ is satisfactory in current FM stereo broadcasting if it is a frequency outside of the main channel signal band and the subchannel signal band, that is, greater than 53 kHz. It is switched at 38 kHz during an FM stereo broadcasting reception in the multiplex demodulator during subchannel signal demodulation. Consequently, the 38 kHz high frequency and the modulation frequency $f_p$ cause a beat that may mix into the audible frequency band.

Thus, when the cut-off frequency of the low pass filter of the multiplex demodulator is set at 15 kHz, a ±15 kHz frequency band is demodulated as audible frequency with 38 kHz, 76 kHz, 114 kHz, and 152 kHz as centers. Therefore, the beatcausing modulation frequency $f_p$ results in $$38 \text{ kHz} \times m - 15 \text{ kHz} \leq f_p \leq 38 \text{ kHz} \times m + 15 \text{ kHz}$$

where m is 2, 3, 4 .... Therefore, when the modulation frequency $f_p$ is selected as $$19 \text{ kHz} \times (2m-1) - 4 \text{ kHz} < f_p < 19 \text{ kHz} \times (2m-1) + 4 \text{ kHz}$$

the signal will not be demodulated as audible frequency by the modulation frequency $f_p$. Or, even when the modulation frequency $f_p$ is selected as a harmonic frequency of 38 kHz, namely, $f_p = m \times 38$ kHz, the output becomes a zero beat and thus, no audible frequency beat is generated.

As explained above, in the present invention, a superheterodyne receiver such as an FM receiver is provided with means to modulate the intermediate frequency signals of the receiver with a modulation frequency that does not affect the received signals and means whereby the demodulated intermediate frequency signals modulated with the modulation frequency are synchronously detected with a frequency n times that of the modulation frequency where n is an integer whose value is at least two. By adjusting the oscillation frequency of the local oscillator with the DC component resulting from the above synchronous detection, distortions due to the amplitude characteristic or phase characteristic of the intermediate frequency band-pass filter affected by tuning and detuning are minimized, thus enabling reception with minimum distortion at all times. Furthermore, since the receiver does not simply lock as in conventional receivers, the distortion can be maintained at a minimum at all times even when the distortion changes.

Hereafter in this specification, the loop of FIG. 5 comprising local oscillator 23, modulation frequency oscillator 11, delay circuit 12, frequency doubler 13, multiplier 14, low pass filter 15, and amplifier 16, will be referred to as a distortion-detection loop while a receiver without this distortion-detecting loop will be referred to as an ordinary receiver, it being understood that the corresponding loops of FIGS. 1 and 4 are, of course, also distortion-detecting loops.

Figure 6:
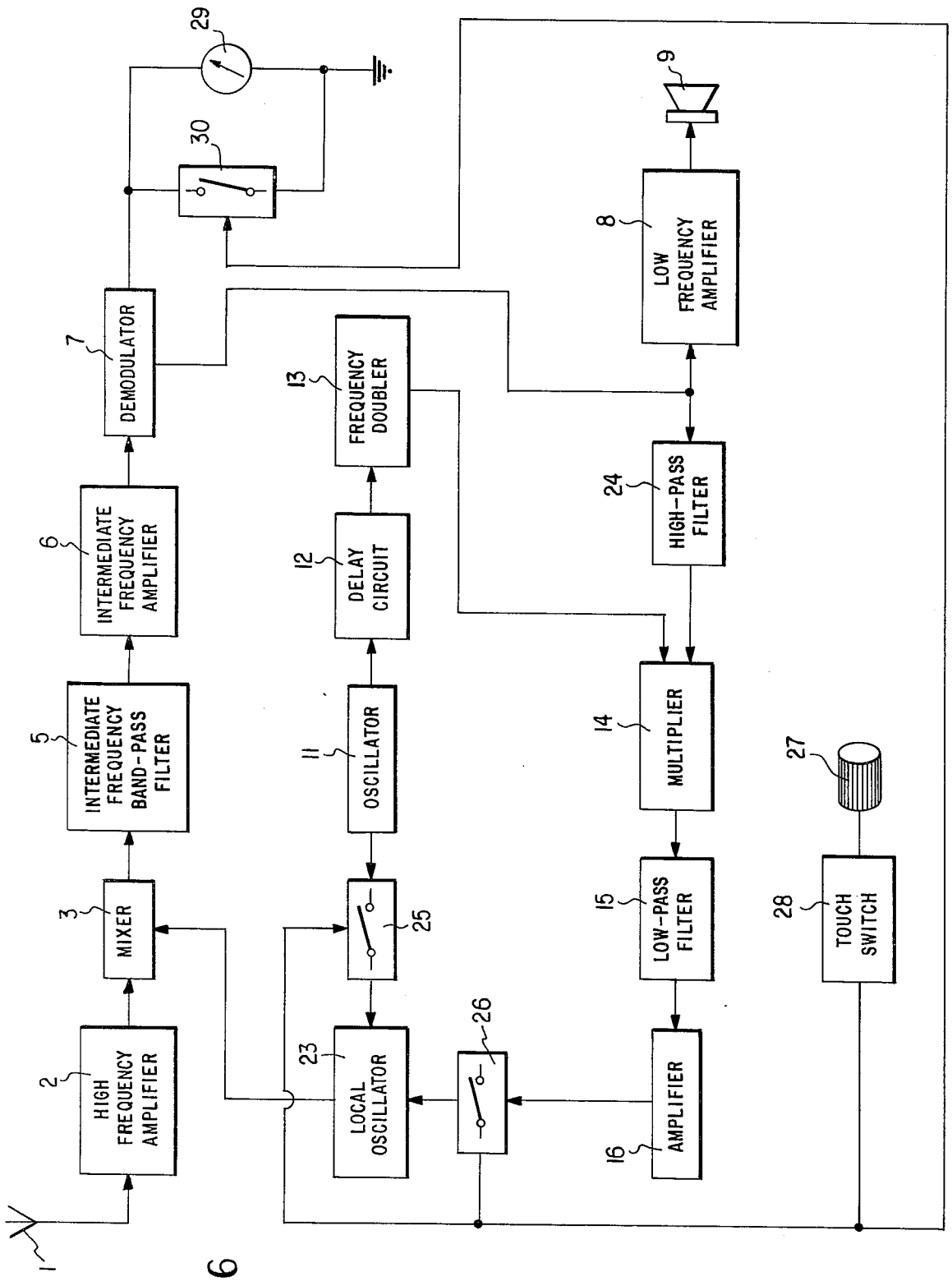
FIGS. 6 and 7 are block diagrams of further illustrative embodiments of this invention.

Reference should now be made to FIG. 6 where another embodiment of the invention will be described. In tuning indicators for use in ordinary receivers, the center of the intermediate frequency band-pass filter band width is set as the zero point or tuning point for signal reception. However, in the case of receivers having the above-mentioned distortion-detecting loop, the loop operates to minimize distortion at all times. Thus, the pointer of the tuning indicator tends to shift with respect to the center of the meter employed in an ordinary receiver. That is, the pointer of the tuning indicator at the time of minimum distortion in a receiver with a distortion-detection loop does not always coincide with the center of the band width of the intermediate frequency bandpass filter 5 due to inclination of the selection characteristic of the intermediate frequency band.

Accordingly, in addition to the distortion-detecting loop of FIG. 5, a touch switch 28 is connected to a tuning knob 27 in FIG. 6. Further, switch elements 25 and 26, which are turned off by the output of touch switch 28 whebn tuning knob 27 is touched, are respectively connected between the output of oscillator 11 and the first input terminal of local oscillator 23 and between the output of amplifier 16 and the second input terminal of local oscillator 23. Also an optional high pass filter 24 may be disposed between the output of demodulator 7 and multiplier 14. When tuning knob 27 is touched, the distortion-detecting loop is disconnected. A switch element 30, which is turned off by the output of touch switch 28, is connected across a tuning indicator 29, which, in turn, is connected between the DC output terminal of demodulator 7 and ground. Thus, when tuning knob 27 is not touched, tuning indicator 29 is short-circuited.

When tuning knob 27 is not touched, switch elements 25, 26 and 30 are turned on, the distortion-detecting loop operates and the FM receiver with the distortion-detecting loop effects reception with minimum distortion. At the same time, since tuning indicator 29 is short-circuited, there is no input to the tuning indicator, and it will point to the meter center or zero.

When tuning knob 27 is touched—that is, when selecting a broadcasting station, switch elements 25, 26 and 30 are turned off by the output of touch switch 28 and the distortion-detecting loop is disconnected. Further, the short-circuit across tuning indicator 29 is removed and the DC output of demodulator 7 enters the indicator which indicates in accordance with the DC output of demodulator 7—that is, an S characteristic output.

Figure 7:
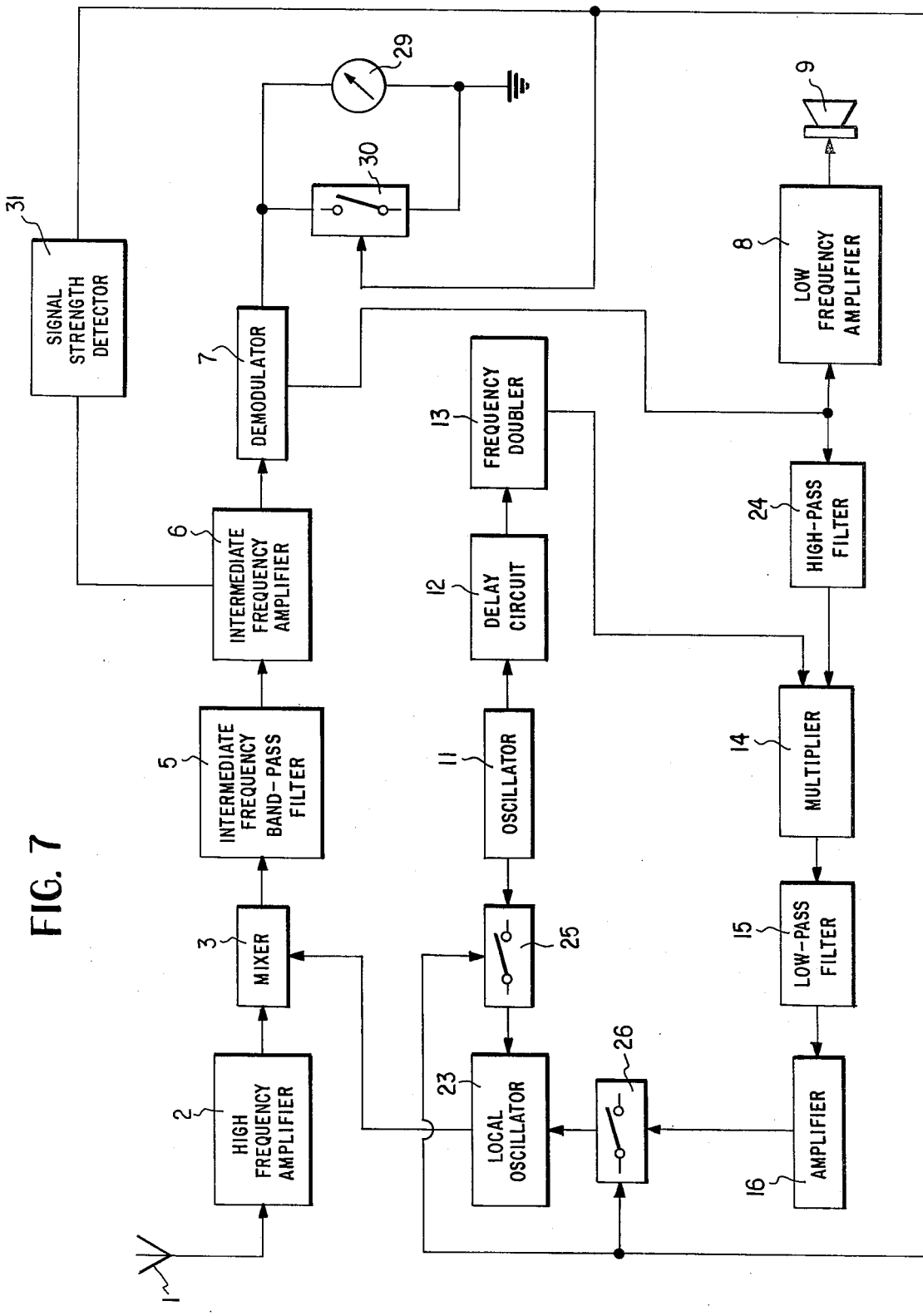

FIG. 7 is a block diagram of another illustrative embodiment of this invention. In addition to the distortion-detecting loop of FIG. 5, this embodiment includes a signal strength detector 31 that AM detects the signal strength of the pre-limiter signal of the intermediate frequency amplifier 6. The detector 31 includes a drive circuit that drives the switching elements 25, 26 and 30 depending on whether the detected signal strength exceeds a predetermined fixed signal strength.

When the signal entering antenna 1 exceeds the set level, signal strength detector 31 detects it and turns on switch elements 25, 26 and 30. Thus, the distortion-detecting loop is actuated and the FM receiver receives signals with minimum distortion. Meanwhile, tuning indicator 29 is short-circuited and no input is applied to the tuning indicator so that the indicator points the meter center or zero.

When the signal entering the antenna 1 is below the set level, signal strength detector 31 detects it and the switch elements 25, 26 and 30 are turned off. Thus, the distortion-detecting loop is disconnected and the short-circuit across tuning indicator 29 is removed so that the DC output of demodulator 7 is applied to the tuning indicator. Hence, the indicator indicates in accordance with the DC output of demodulator 7, namely the S characteristic output.

In the embodiment of FIG. 6, the pointer of tuning indicator 29 is positioned at the meter center by not manipulating the tuning knob and, in the embodiment of FIG. 7, by detecting the input above the set level. Further, the same results can also be achieved by, for example, detecting the noise of the intermediate frequency signals. As explained above, when the embodiments of FIGS. 6 and 7 are used, the pointer of the tuning indicator points to the zero position when the distortion-detecting loop is in operation to receive signals with minimum distortion because no input is applied to the tuning indicator while this loop is operating. Thus, the problem of the pointer of the tuning indicator shifting from the meter center due to operation of the distortion-detecting loop is eliminated.

Figure 8:
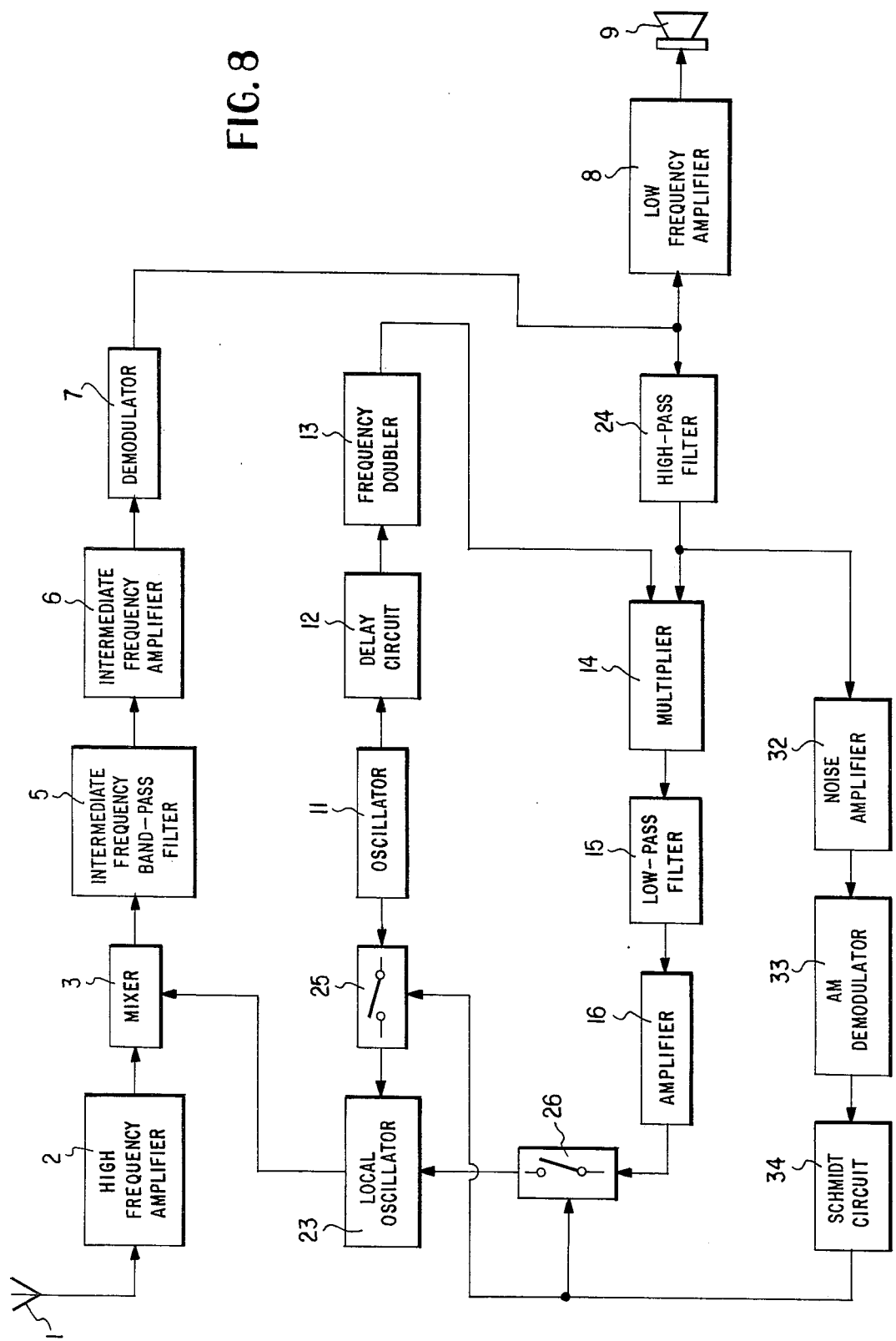
FIG. 8 is a block diagram of a further illustrative embodiment of the invention.

Reference should now be made to FIG. 8. As stated above, the receiver of FIG. 5 with its distortion-detecting loop receives signals with minimum distortion at all times, as do those of FIGS. 1 and 4. However, the receiver may become unstable depending upon the conditions of signal reception. These conditions include (a) when mixing occurs and (b) when the S/N of the input into the distortion-detecting loop—that is, the output signal of high-pass filter 24 (or demodulator 7) to multiplier 14, is poor. With respect to condition (a), when both the desired signal and an interference signal are present at the output of demodulator 7, there are times when it cannot be determined which distortion components of the signals are utilized by the distortion-detecting loop for control. And, regarding (b), when the input voltage of antenna 1 is low and the noise following demodulation is high, both the distortion component of the signal at the angular modulation frequency p and the noise component appear at the output terminal of high-pass filter 10 and are applied to the distortion-detecting loop. Consequently, in addition to the time-fixed DC level of the distortion component, a time-irregular noise is applied to the distortion-detecting loop causing the voltage of the second input terminal of the local oscillator 23 to surge. Accordingly, the embodiment of FIG. 8 prevents unstable conditions in an FM receiver having a distortion-detecting loop by detecting the noise component or beats between the desired signals and interfering signals and disconnects the distortion-detecting loop when they are above a fixed level.

In addition to the distortion-detecting loop of FIG. 5, the embodiment of FIG. 8 includes a noise amplifier 32 at the output of high-pass filter 24, an AM demodulator 33 that detects the output signal from noise amplifier 32 and a Schmidt circuit 34 that detects the output level of AM demodulator 33. Switch elements 25 and 26 are driven by Schmidt circuit 34.

Thus, the noise components or the desired signal and interfering signal beats at the input to the distortion-detecting loop—that is, the terminal of multiplier 14 connected to high-pass filter 24, are amplified and detected. When the noise components or beats exceed the fixed level, the output of Schmidt circuit 34 turns switches 25 and 26 off and disconnects the distortion-detecting loop.

Therefore, when noise and/or beats above the fixed level are detected, the distortion-detecting loop is disconnected from the receiver. Hence, the receiver with its distortion-detecting loop operates as an ordinary receiver and unstable operation of the distortion-detecting loop does not occur. In the embodiment of FIG. 8, the noise and beats are detected at the FM demodulation output. However, they may also be detected from the intermediate frequency signals. Also, the distortion-detecting loop is described as being disconnected by switch elements 25 and 26. However, either one of the switch elements may be omitted.

Reference should now be made to FIG. 6. As discussed above, the receiver of FIG. 5 can receive signals with minimum distortion at all times as can those of FIGS. 1 and 4. However, even when the oscillation frequency of local oscillator 23 is mechanically changed by manipulating the variable capacitor of the local oscillator 4, the distortion-detecting loop still operates. Thus, the tuning knob had poor manipulability because the oscillation frequency of local oscillator 23 was being electrically controlled to keep the distortion at the minimum state.

Therefore, in view of the foregoing, it should be noted how the embodiment of FIG. 6 also improves the manipulability of the tuning knob of a receiver having a distortion-detecting loop. In selecting a station channel—that is, when a part of the body touches tuning knob 27, touch switch 28 opens switch elements 25 and 26. Thus, the distortion-detecting loop is disconnected. Therefore, the output frequency of local oscillator 23 changes as in the case of ordinary FM receiver by manipulation of tuning knob 27 and the manipulability of the tuning knob is improved. Further, when the manipulation of tuning knob 19 has been completed—that is, when the knob is no longer touched, switch elements 25 and 26 are closed and the distortion-detecting loop is actuated again. Although, in the embodiment of FIG. 6, the distortion-detecting loop is removed by switch elements 25 and 26, one of these elements may be omitted.

Figure 9:
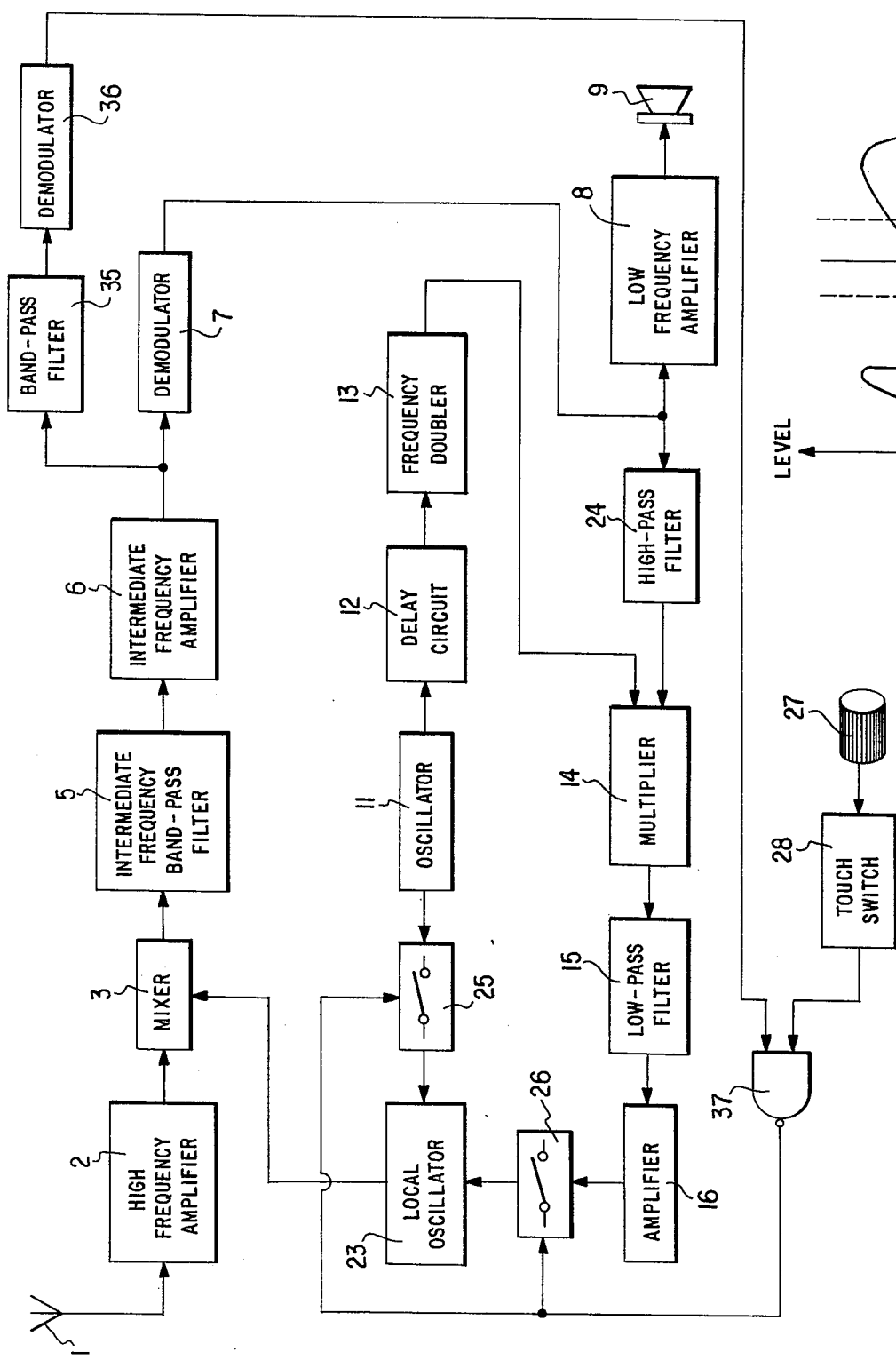
FIG. 9 is a block diagram of a further illustrative embodiment of the invention.

Reference should now be made to FIG. 9. In addition to the receiver of FIG. 5, this embodiment includes a band-pass filter 35 responsive to the output of intermediate frequency amplifier 6, a demodulator 36 responsive to the output of band-pass filter 35, and a NAND gate 37, one input of which is responsive to the output of demodulator 36. The output of touch switch 28 is applied to the other input of NAND gate 37. Switching elements 25 and 26 are driven by the output of NAND gate 37.

Figure 10:
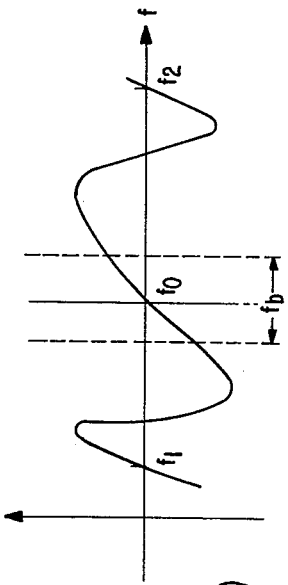
FIG. 10 is a waveform diagram used to explain the operation of the embodiment of FIG. 9.

Referring to FIG. 10, assume the band width of band-pass filter 35 is $f_b$ and its enter frequency is the center frequency of the intermediate frequency band-pass filter, $f_0$. Thus, when the operation frequency in the intermediate frequency band of an FM receiver with a distortion-detecting loop is within the band width of band-pass filter 35, $f_b$, demodulator 22 produces a high potential output "1", which is applied to one input of NAND gate 37. When it is outside the band width $f_b$, a low potential output "0" is applied to the one input of NAND gate 37. On the other hand, when tuning knob 27 is touched, touch switch 28 outputs a low potential output "0" and when it is not touched, the touch switch outputs a high potential output "1". Therefore, NAND gate 37 produces outputs according to the truth table of Table 1.

TABLE 1

| Output of the touch switch 28 | Output of the demodulator 36 | NAND gate 37 output |
| --- | --- | --- |
| 0 | 0 | 1 |
| 0 | 1 | 1 |
| 1 | 0 | 1 |
| 1 | 1 | 0 |

When the output of NAND gate 37 is high potential "1", switch elements 25 and 26 are off and when the low potential "0" is outputted, the switch elements are on.

Thus, when a person touches tuning knob 27, the switch elements become non-conductive and the distortion-detecting loop is disconnected. When the tuning knob is not touched and when the operation frequency in the intermediate frequency band is within the band width of band-pass filter 35, $f_b$, the distortion-detecting loop is actuated. Therefore, when selecting a station channel—that is, when a person touches the tuning knob, the distortion-detecting loop is disconnected and works as in an ordinary FM receiver. The manipulability of the tuning knob 27 becomes the same as that in an ordinary FM receiver and the manipulability of tuning knob is improved. Also, during manipulation of tuning knob 27, when the contact between tuning knob 27 and the body is released, if the intermediate operation frequency has reached inside band width $f_b$ of band-pass filter 35, the distortion-detecting loop is actuated to adjust the output frequency of local oscillator 23 to minimize distortion.

The change in the distortion component with respect to the detuning frequency caused by the intermediate frequency band-pass filter 5 is shown in FIG. 10 where the frequency is along the abscissa and the level of distortion along the ordinate. As shown in the graph, depending upon intermediate frequency band-pass filter 5, not only the center frequency $f_0$, but a number of other stable points are sometimes present such as $f_1$ and $f_2$. However, as shown in FIG. 10, because of band-pass filter 35 with band width $f_b$, the distortion-detecting loop is actuated only within band width $f_b$. Thus, the distortion-detecting loop will not be actuated at other stable points such as $f_1$ and $f_2$.

By substituting for band-pass filter 35 and demodulator 36, the same action and effect as in the embodiment of FIG. 9 can be obtained by amplifying the DC output of demodulator 7, S characteristic output with an absolute value amplifier, by detecting a fixed level of the output of the absolute value amplifier with a Schmidt circuit, and by applying the output of the Schmidt circuit to one input terminal of NAND gate 37. The same action and effect as in the FIG. 9 embodiment can also be obtained by using a noise amplifier to detect noise that appears at the output of demodulator 7.

Thus, in the embodiments of FIGS. 6 and 9, the manipulability of the tuning knob of an FM receiver with a distortion-detecting loop is improved.

Figure 11:
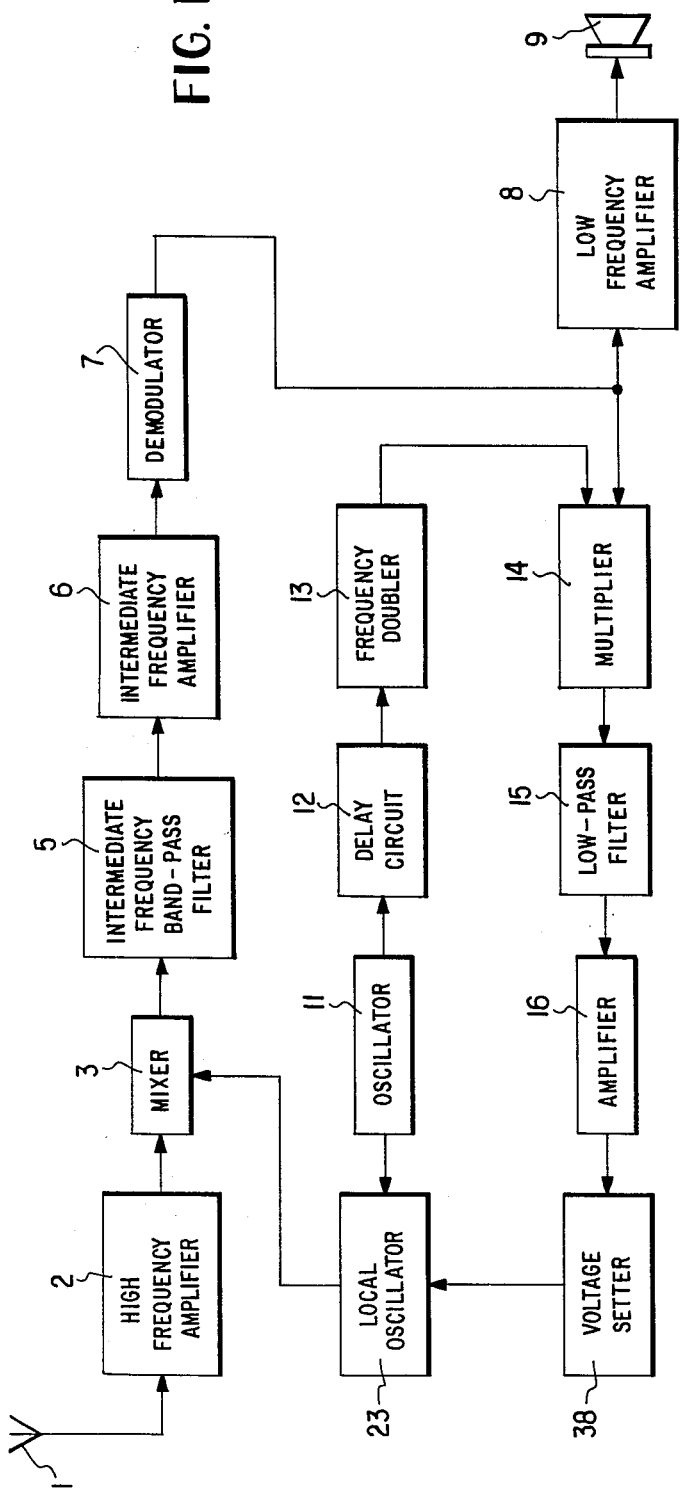
FIG. 11 is a block diagram of a further illustrative embodiment of the invention.

Reference should now be made to FIG. 11. As explained hereinbefore, the receiver of FIG. 5 receives signals by automatically adjusting the output frequency of local oscillator so that reception can be made with minimum distortion, as do the embodiments of FIGS. 1 and 4. However, when distortion is present in the means that modulates the intermediate frequency signals—for example, when distortion is present in the output of oscillator 11, the distortion-detecting loop is also actuated on this distortion. In other words, when distortion occurs in the means for modulating the intermediate frequency signals, the distortion-detecting loop detects it as though this distortion was caused by the input signals in passing through the intermediate frequency band-pass filter 5 and changes the output frequency of the local oscillator 23 (or 4) in an attempt to also cancel this distortion component in the working range of the intermediate frequency band-pass filter. Therefore, the distortion-detecting loop is actuated using as a minimum distortion point the shifted amount of output frequency of local oscillator 23 that deviates in correspondence to the distortion present in the means for modulating the intermediate frequency signals. This means that the distortion-detecting loop is actuated on the input signals at the point, where the distortion is deteriorated by the shifted amount of the output frequency of the local oscillator, as the minimum distortion point.

The embodiment of FIG. 11 enables easy correction of the distortion caused by that present in the means for modulating the intermediate frequency signals. Thus, a variable voltage setting means 38 is provided between the output of amplifier 16 and the second input terminal of local oscillator 23. The output voltage of amplifier 16 is superposed on the set voltage of variable voltage setting means 38 and also applied to the second input terminal of local oscillator 23.

The output frequency of local oscillator 23 can thus be changed by superposing the set voltage established by variable voltage setting means 38 on the output voltage of amplifier 16—that is, on the output voltage of distortion-detecting loop.

Figure 12:
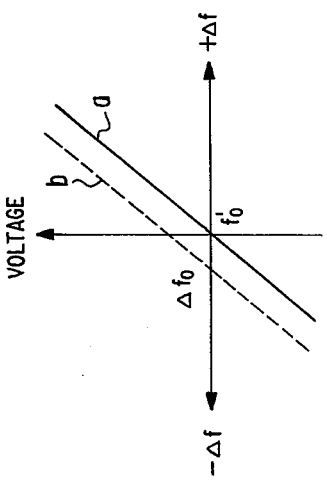
FIG. 12 is a diagram used for explaining the operation of the embodiment of FIG. 11.

For example, if it is assumed that the modulated intermediate frequency signals become distorted only by passing through intermediate frequency band-pass filter 5, the output voltage of amplifier 16 changes the output frequency of local oscillator 23 according to the straight line shown in FIG. 12 with a solid line a. The frequency at the point of minimum distortion in the case is the frequency $f_0'$. In FIG. 12, the voltage applied to the second input terminal of local oscillator 23 is plotted on the ordinate and the deviation of the output frequency of local oscillator 23 from the reference frequency is plotted on the abscissa.

However, when distortion occurs in the means for modulating the intermediate frequency signal—for example, when distortion is present in the output of oscillator 11, the above-mentioned $f_0'$ is not the point of minimum distortion for the input FM signal as stated previously.

If it is assumed that the output frequency of $(f_0' - \Delta f_0)$ in FIG. 12 is the point of minimum distortion for the input FM signal, the output voltage of the variable voltage setting means 38 is adjusted and the straight line shown by solid line a in FIG. 12 deviates by the amount of the output voltage and shifts as shown by the broken line b in FIG. 13 so that the voltage at the second input terminal of local oscillator 23 that produces the output frequency of $(f_0' - \Delta f_0)$ becomes the reference voltage. Thus, by setting the output voltage of variable voltage setting means 38, the distortion present in the means for modulating the intermediate frequency signal is cancelled and the output frequency of local oscillator 23 can be adjusted to produce minimum distortion for the input FM signal at all times.

As explained above, in the embodiment of FIG. 11, a variable voltage setting means that can change the frequency of a local oscillator by superposing on the output voltage of the distortion-detecting loop is employed whereby element errors of various components of the distortion-detecting loop and distortions occurring in the means for modulating the intermediate frequency signals, etc. can be corrected with ease and reception of input FM signals with minimum distortion is made possible at all times. Further, the linearity obtained during FM modulation of the intermediate frequency signal need not be particularly strict and its adjustment is also made easy.

What is claimed is:

1. A superheterodyne receiver comprising
 a local oscillator;
 a mixer responsive to an output of said local oscillator and a signal received by the receiver to provide an intermediate frequency signal;
 a further oscillator for generating a fixed modulating frequency;
 means for frequency modulating said intermediate frequency signal with said fixed modulation frequency;
 means for demodulating the intermediate frequency signal whose frequency has been modulated with said fixed modulation frequency;
 means for providing a signal having a frequency n times that of said fixed modulation frequency where n is an integer whose value is at least two;
 means for synchronously detecting the output of said demodulating means with said signal having a frequency n times that of said modulation frequency, and
 control means for controlling the frequency of said local oscillator with the output of said synchronous detecting means.

2. A receiver as in claim 1 where said receiver is an FM receiver.

3. A receiver as in claim 1 or 2 where n is two.

4. A receiver as in claim 1 or 2 where said fixed modulation frequency is any frequency between $[(2m-1) \times 19 - 4]$ kHz and $[(2m-1) \times 19 + 4]$ kHz where m is an integer greater than two.

5. A receiver as in claim 1 or 2 where said fixed modulation frequency is m $\times$ 38 kHz where m is an integer greater than two.

6. A receiver as in claim 1 or 2 where said means for frequency modulating the intermediate frequency signal is responsive to the output of said mixer.

7. A receiver as in claim 1 or 2 where said means for frequency modulating the intermediate frequency signal includes means for modulating said local oscillator with said fixed modulation frequency to thereby indirectly frequency modulate said intermediate frequency signal with said fixed modulation signal.

8. A receiver as in claim 1 or 2 where said means for providing said signal having a frequency n times that of said fixed modulation frequency includes a frequency multiplier responsive to said further oscillator.

9. A receiver as in claim 1 or 2 including a voltage controlled oscillator for generating said signal having a frequency n times that of said fixed modulation frequency; frequency dividing means for dividing the frequency of the output of said voltage controlled oscillator by n; phase comparing means for comparing the phases of the output signals from said frequency dividing means and said demodulating means and filter means responsive to said phase comparing means for controlling said voltage controlled oscillator.

10. A receiver as in claim 1 or 2 including means for maintaining the output of said demodulating means in phase with the output of said means for providing a signal having a frequency n times that of said fixed modulation frequency.

11. A receiver as in claim 1 or 2 including means for maintaining a predetermined phase difference between the output of said demodulating means and the output of said means for providing a signal having a frequency n times that of said fixed modulation frequency.

12. A receiver as in claim 11 where n=2 and said predetermined phase difference is $\pi/4$ radians.

13. A receiver as in claim 1 or 2 including tuning means for tuning said receiver, a tuning indicator responsive to the demodulating means and means for de-activating said tuning indicator in response to said control means controlling the frequency of said local oscillator and for activating said tuning indicator in response to said control means not controlling the frequency of said local oscillator.

14. A receiver as in claim 1 or 2 where said further oscillator, said means for frequency modulating the intermediate frequency signal, said synchronous detecting means, said means for providing a signal having a frequency n times that of the fixed modulation frequency, and said control means comprise a distortion-detecting means.

15. A receiver as in claim 14 including a tuning indicator responsive to the demodulating means, tuning means for tuning said receiver and means for at least partially inhibiting the operation of said distortion-detecting means in response to actuation of said tuning means and for enabling the operation of said distortion-detecting means in response to said tuning means not being actuated.

16. A receiver as in claim 14 including means for sensing the strength of said intermediate frequency signal and means for enabling the operation of said distortion-detecting means in response to said strength being greater than a predetermined level and for at least partially inhibiting the operation of said distortion-detecting means in response to said strength being less than said predetermined level.

17. A receiver as in claim 14 including tuning means for tuning said receiver first sensing means for sensing whether the intermediate frequency signal is within a predetermined frequency band and second sensing means for sensing whether said tuning means has been actuated and means responsive to said first and second sensing means for enabling the operation of said distortion-detecting means in response to said intermediate frequency being within the predetermined frequency band and said tuning means not being actuated and for at least partially inhibiting the operation of said distortion-detecting means in response to said intermediate frequency not being within the predetermined frequency band and/or said tuning means being actuated.

18. A receiver as in claim 1 including means for sensing a noise level in the output of said demodulating means and means for at least partially inhibiting the operation of said distortion-detecting means in response to said noise level being greater than a predetermined level and for enabling the operation of said distortion-detecting means in response to said noise level being less than said predetermined level.

19. A receiver as in claim 14 including means for generating a control signal proportional to distortion which arises in the distortion-detecting means and means for further controlling said local oscillator with said last-mentioned control signal to substantially cancel the effect of said last-mentioned distortion on the frequency of said intermediate frequency signal.

20. A superheterodyne receiver comprising
a local oscillator;
a mixer responsive to an output of said local oscillator and a signal received by the receiver to provide an intermediate frequency signal;
demodulating means for demodulating said intermediate frequency signal; and
distortion-detecting means responsive to the demodulating means including means for generating a control signal proportional to distortion in said intermediate frequency signal and for controlling said local oscillator with said control signal to vary the frequency thereof and minimize said distortion in the intermediate frequency signal where said distortion-detecting means includes means for frequency modulating said intermediate frequency signal with a fixed modulating frequency; and for generating said fixed modulating frequency means for providing a signal having a frequency n times said fixed modulation frequency where n is an integer whose value is at least 2; means for generating said control signal by synchronously detecting the output of said demodulating means with said signal having a frequency n times that of said fixed modulation frequency and means for controlling the frequency of said local oscillator with the output of said synchronous detecting means.

21. A receiver as in claim 20 where said receiver is an FM receiver.

22. A receiver as in claim 20 and 21 where said receiver includes an intermediate frequency band-pass filter disposed between said mixer and said demodulating means, said distortion being at least in part caused by said last-mentioned filter.

23. A receiver as in claim 22 where said control signal is proportional to an amplitude characteristic of said intermediate frequency band-pass filter.

24. A receiver as in claim 22 where said control signal ir proportional to a phase characteristic of said intermediate band-pass filter.

* * * * *